United States Patent [19]

Nakaizumi

[11] Patent Number: 4,933,903

[45] Date of Patent: Jun. 12, 1990

[54] STATIC MEMORY DEVICE PROVIDED WITH HIGH-SPEED WRITING CIRCUIT

[75] Inventor: Kazuo Nakaizumi, Tokyo, Japan

[73] Assignee: NEC Corporation, Tokyo, Japan

[21] Appl. No.: 357,460

[22] Filed: May 26, 1989

[30] Foreign Application Priority Data

May 26, 1988 [JP] Japan .................................. 63-131026

[51] Int. Cl.$^5$ .............................................. G11C 7/00
[52] U.S. Cl. ................................. 365/189.11; 365/154
[58] Field of Search ........... 365/154, 155, 156, 189.11, 365/190, 207, 208

[56] References Cited

U.S. PATENT DOCUMENTS 4,791,613 12/1988 Hardee ................................. 365/190

FOREIGN PATENT DOCUMENTS 63-893 1/1988 Japan ................................. 365/154

Primary Examiner—James W. Moffitt
Attorney, Agent, or Firm—Sughrue, Mion, Zinn, Macpeak & Seas

[57] ABSTRACT

A static semiconductor memory device having an improved write circuit which can perform a write operation at a high speed is disclosed. The memory device comprises a plurality of memory cells each having a flip-flop holding a first level and a second level lower than the first level and a write circuit for operatively generating a write data signal which is applied to a selected one of the memory cells, the write data signal selectively assuming a low level of write data signal which is lower than the second level.

5 Claims, 6 Drawing Sheets

STATIC MEMORY DEVICE PROVIDED WITH HIGH-SPEED WRITING CIRCUIT

BACKGROUND OF THE INVENTION

1. Field of the Invention

The present invention relates to a static type memory device and, more particularly, to a static type memory device employing MES type field effect transistors (MESFETs) formed of compound semiconductor material such as GaAs.

2. Description of the Related Art

Static memories (SRAMs) have been widely utilized in various fields because of their high-speed operations. Recently, many approaches have been made on developments of SRAMs employing GaAs-MESFETs to further increase operation speed. In a conventional SRAM employing MESFETs, each of memory cells includes a flip-flop supplied with a high-side power source $V_{DD}$ and a low-side power source $V_{SS}$ and a pair of transfer MESFETs connected between the flip-flop and a pair of digit lines. A plurality of pairs of digit lines are connected to a pair of common data lines through a plurality of pairs of column selection MESFETs. A read-out circuit and a write-in circuit are connected to the pair of common data lines. The write-in circuit is supplied with the high-side and low-side power source $V_{DD}$ and $V_{SS}$ and operatively applies true and complementary input data signals having amplitude between $V_{DD}$ and $V_{SS}$ at maximum to the pair of common data lines. The input data signals applied to the pair of common data lines are transferred to one pair of digit lines through a selected pair of column selection MESFETs thereby to set a state of the selected memory cell. In general, a ground potential (0 V) and $-1.9$ V employed as $V_{DD}$ and $V_{SS}$ in the conventional SRAM. The flip-flop of the memory cell assumes $-1.3$ V and $-1.9$ V at a pair of input/output nodes thereof, because the Schottky diodes between a gate and a drain of the high-level output side MESFET is forward biased, and because the Schottkey diode of the gate and a drain has a forward voltage of approximately 0.6 V. In such memory device, the selected pair of digit lines are supplied with input data signals of 0 V and $-1.9$ V by the write-in circuit. Therefore, when the input data of $-1.9$ V is applied to the high level output side MESFET. The voltage difference therebetween becomes 0.6 V. For write-in operation, the flip-flop must be turned by the 0.6 V.

For turning the flip-flop, parasitic capacitors of the MESFETs in the flip-flop must be first charged prior to drive MESFETs. However, because the MESFET's have large sizes compared to the column selection MESFET's, it takes a very long time until the parasitic capacitors are charged-up by the above-mentioned small voltage 0.6 V. As a result, a speed of the memory is not sufficiently improved particularly in a write operation in the conventional SRAM.

SUMMARY OF THE INVENTION

It is an object of the present invention to provide a static memory device which can operate at a high speed.

It is another object of the invention to provide a static memory device composed of MESFETs provided with an improved write circuit operable at a high speed.

The semiconductor memory device according to the present invention comprises a plurality of memory cells, each of the memory cells including a flip-flop and holding a first level as a high level and a second level as a low level, a write circuit for generating a write data signal and a selection circuit for operatively applying the write data signal to a selected memory cell for writing the write data signal thereto, and is featured in that the write data signal assumes a third level lower than the second level as its low level.

According to the present invention, a voltage difference between the high level (i.e. the first level) of the memory cell and the low level (i.e. the third level) of the write data signal is enlarged compared to the conventional case where the write data signal assumes the second level as its low level. Therefore, the state of the memory cell can be inverted rapidly through a write operation by the large voltage difference applied to the memory cell.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Prior Art

Figure 1:
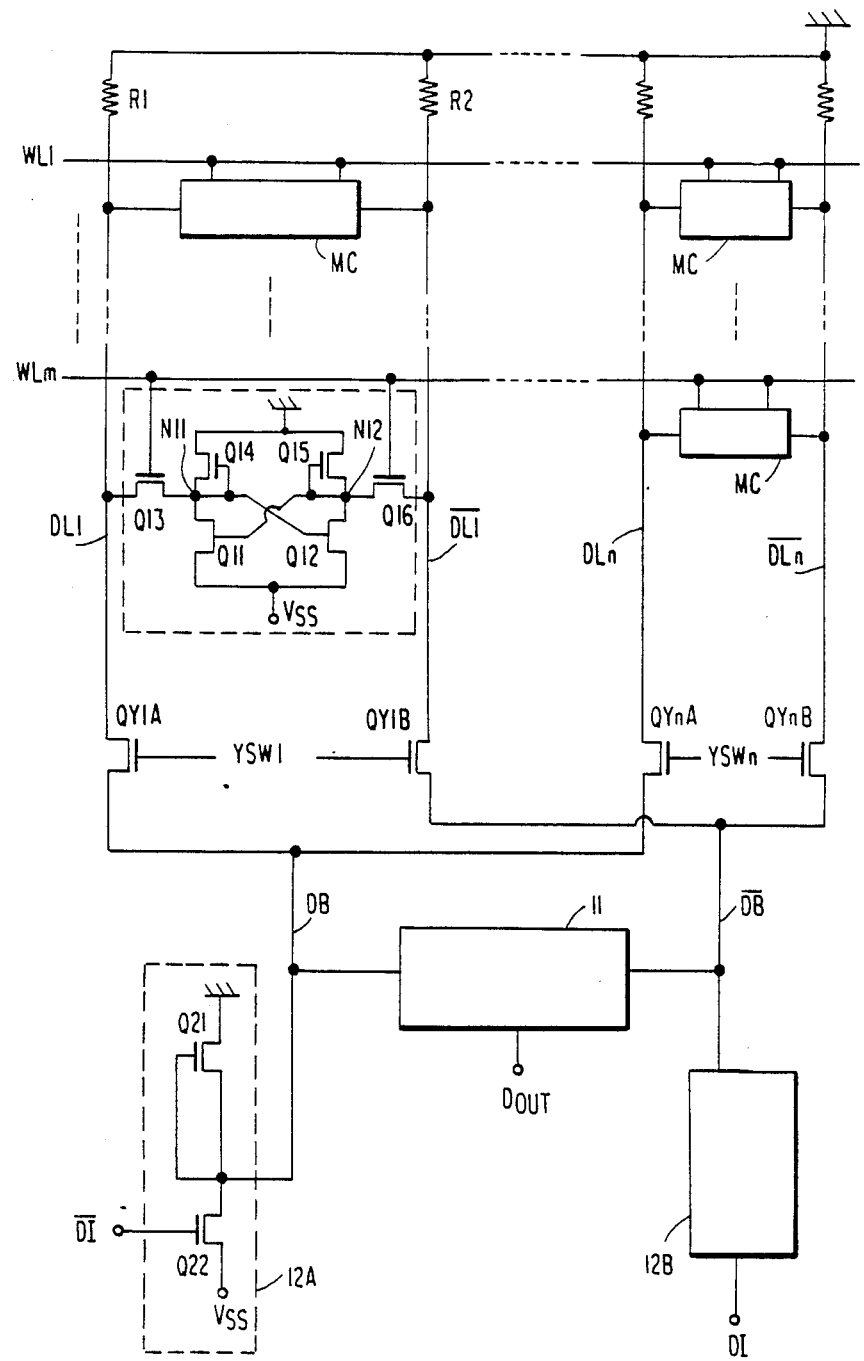
FIG. 1 is a schematic block diagram showing a major part of a static memory in the prior art.
Figure 2:
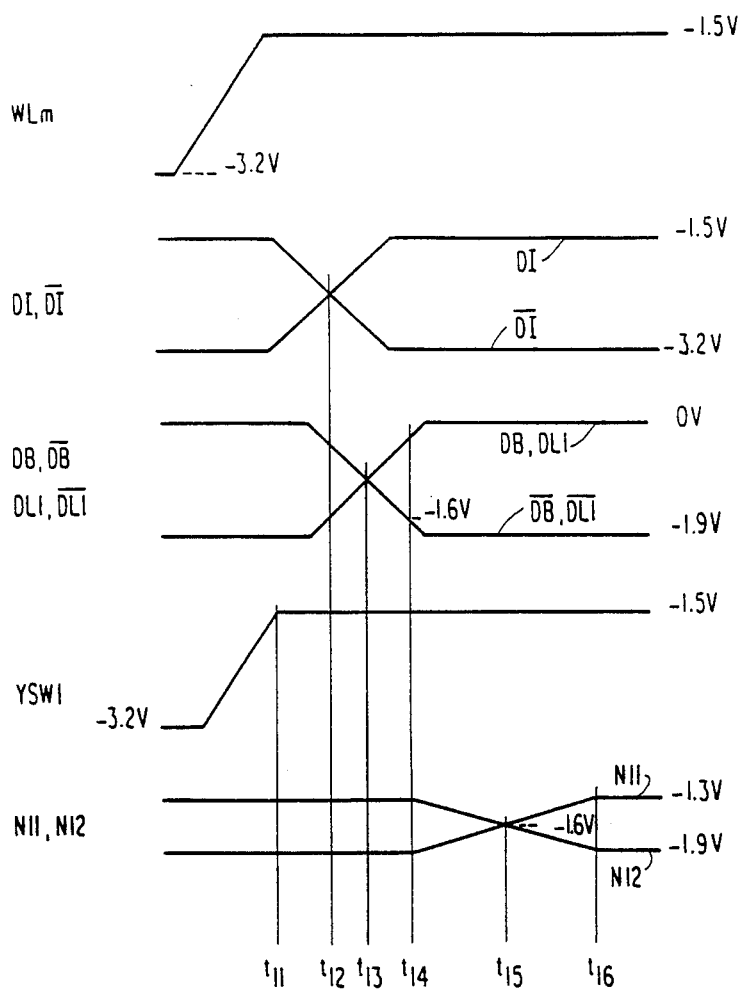
FIG. 2 is a timing diagram showing operation of the memory of FIG. 1.

With reference to FIGS. 1 and 2, a static memory in the prior art will be explained.

In the following description, N-channel depletion type MESFETs having threshold voltages of $-0.5$ V and N-channel enhancement MESFETs having threshold voltages of 0.2 V are employed as transistors.

As shown in FIG. 1, the memory comprises an array of memory cells MC arranged in a matrix form of rows and columns, word lines WL1–WLm arranged in rows and a plurality of pairs of digit lines DL1, $\overline{DL1}$–DLn, $\overline{DLn}$ arranged in columns and connected to a ground voltage via resistors R1, R2 in a known way. Each of memory cells MC includes a flip-flop composed of enhancement MESFETs (E-FETs) $Q_{11}$, $Q_{12}$ and depletion MESFETs (D-FETs) $Q_{14}$, $Q_{15}$ and a pair of transfer D-FETs $Q_{13}$ and $Q_{16}$ coupled between input/output nodes $N_{11}$ and $N_{12}$ of the flip-flop and the corresponding pair of digit lines e.g. DL1, $\overline{DL1}$. The pairs of digit lines are connected to a pair of common data lines DB, $\overline{DB}$ via a plurality of pairs of column selection D-FETs QY1A, QY1B–QYnA, QYnB which are controlled by column selection signals YSW1–YSWn, respectively. A read-out circuit 11 for outputting data at the data lines DB, $\overline{DB}$ to an output terminal $D_{OUT}$ in a read mode, and a pair of write circuits 12A and 12B for applying true and complementary write data signals to the data lines DB, $\overline{DB}$ in response to input signals $\overline{DI}$, DI, in a write mode. The write circuit 12A includes an inverter composed of D-FETs $Q_{21}$ and $Q_{22}$ and the write circuit 12B has the same circuit structure as the write circuit 12A. In this memory, the memory cells MC and the write circuits 12A and 12B receive a ground potential as a high level power source and a low level power source $V_{SS}$ which is $-1.9$ V in this memory. As is well known, each of E-FETs and D-FETs has a gate-drain voltage of 0.6 V when the Schottky diodes present between the gate and the source is forward biased. Therefore, a high level at one of the nodes $N_{11}$ and $N_{12}$ of the memory cell is kept at $-1.3$ V while a low level at the other of the nodes $N_{11}$ and $N_{12}$ is at $-1.9$ V.

With reference to FIG. 2, a write operation of the memory of FIG. 1 will be explained on a case where the word line WLm and the pair of digit lines DL1, $\overline{DL1}$ are selected.

The word line WLm is selected to assume a high level ($-1.5$ V) and the column selection signal YSW1 is selected to assume a high level ($-1.5$ V) at a time point $t_{11}$. Therefore, the D-FETs $Q_{13}$ and $Q_{16}$ of the memory cells connected to the selected word line WLm are rendered conductive and the D-FETs QY1A and QY1B are rendered conductive. In this instance, data at the input DI, $\overline{DI}$ and the state of the selected memory cell are the same and therefore, the data lines DB, $\overline{DB}$, the digit lines DL1, $\overline{DL1}$ and the nodes $N_{11}$ and $N_{12}$ of the selected memory cell are in the equilibrium condition.

Then, the input data DI and $\overline{DI}$ are crossed to be inverted at a time point $t_{12}$ and thereafter the states of the data lines DB, $\overline{DB}$ and the digit lines DL1, $\overline{DL1}$ are inverted at a time point $t_{13}$. Then, when the level of the digit line $\overline{DL1}$ becomes at $-1.6$ V or lower at a time point $t_{14}$, the state of the flip-flop of the selected memory cell starts to be inverted because the E-FET $Q_{52}$ of the memory cell becomes non-conductive to rise the potential node $N_{12}$. Then, the potentials at the nodes $N_{11}$ and $N_{12}$ of the memory cell are crossed at a time point $t_{15}$ and thereafter the inversion of the memory cell is completed at a time point $t_{16}$.

In the above write operation to invert the state of the memory cell, since the FETs $Q_{11}$ and $Q_{12}$ usually have a size which is 10 or more times as large as that of $Q_{14}$ and $Q_{15}$ to improve data holding characteristics of the memory cell, during the write operation, therefore, if the low level of the digit line is $-1.9$ V and the source-drain voltage of $Q_{13}$, $Q_{16}$ of the memory cell is smaller than 0.6 V, then the period from time $t_{14}$ to $t_{16}$ become very long (about 1 ns).

In the aforementioned conventional write circuit constituted by the compound semiconductor MESFETs and in the memory cell, the low level ($-1.9$ V) of the memory cell is equal to the low level of the digit line. Therefore, an extended period of time is required before the low level of the digit line reaches the level ($-1.6$ V) at which the memory cell starts the inversion. Furthermore, even when the low level of the digit line becomes $-1.9$ V, VDS of the transfer transistor $Q_{56}$ of the memory cell is not greater than 0.6 V. Therefore, a time which is as long as about 1 ns is needed for inverting the memory cell.

EMBODIMENT

Figure 3:
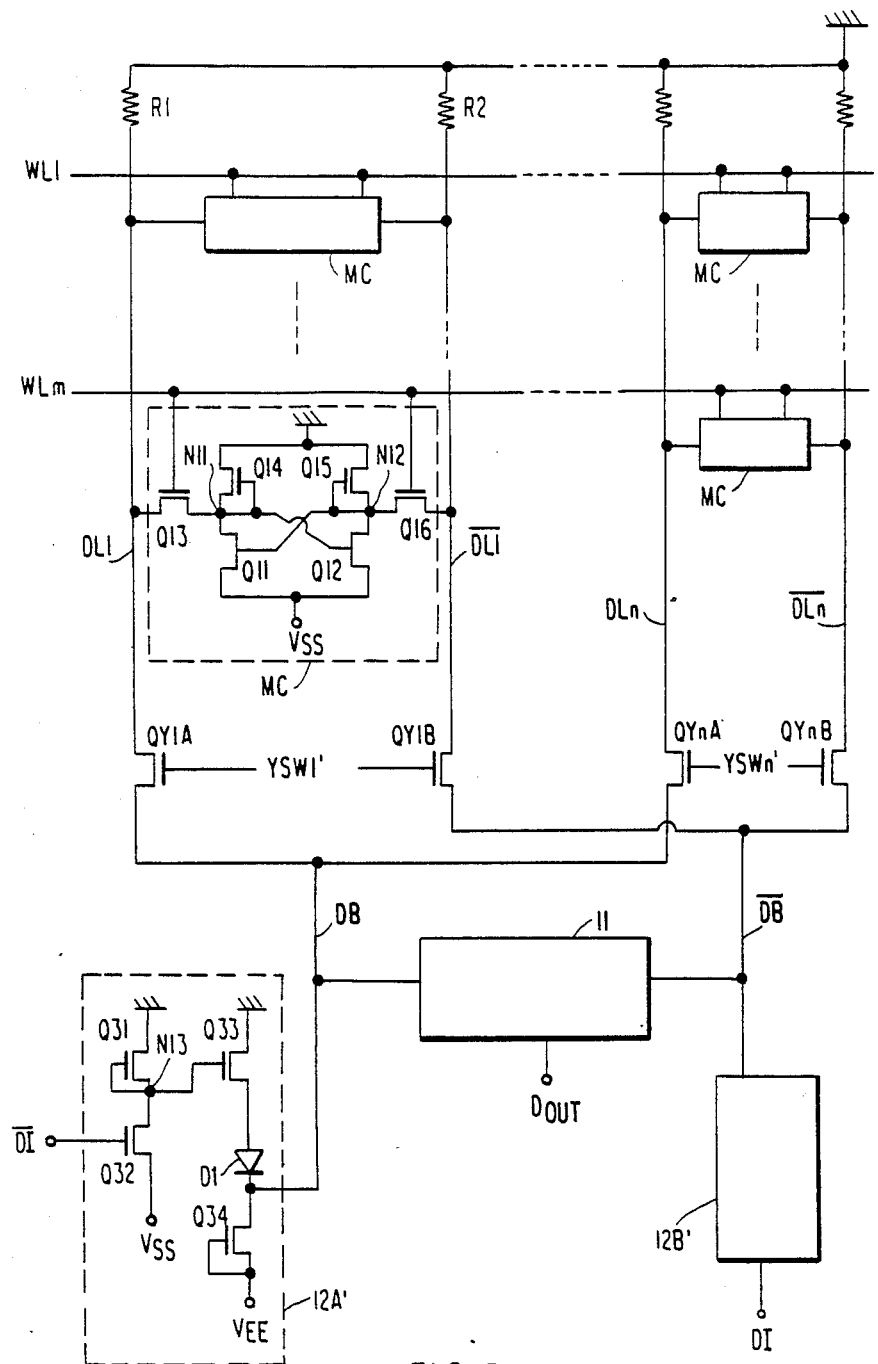
FIG. 3 is a schematic block diagram showing a major part of a static memory according to a first embodiment of the present invention.
Figure 4:
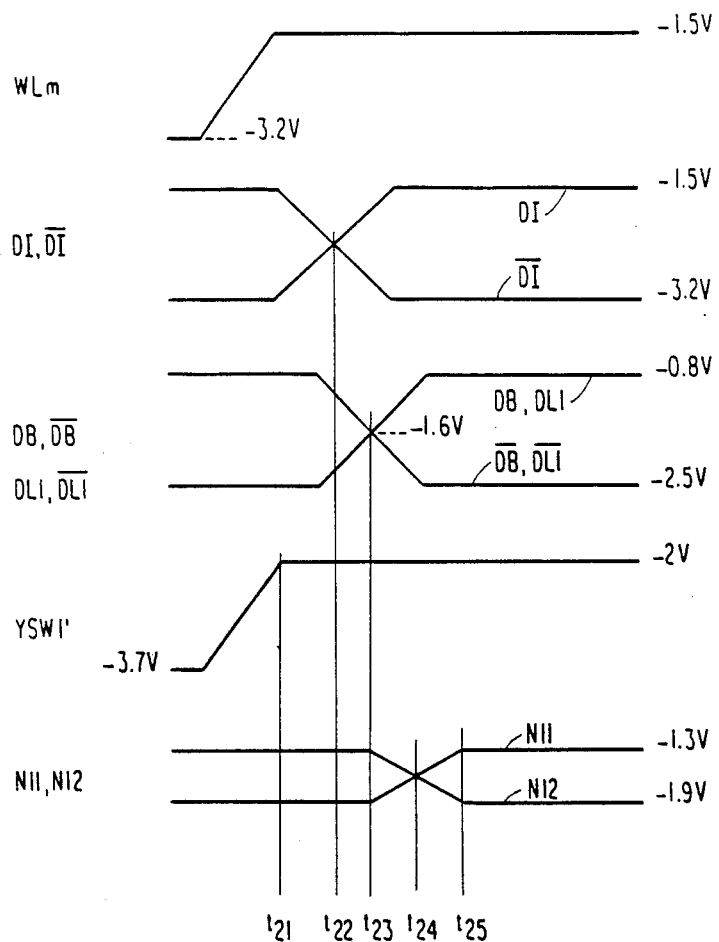
FIG. 4 is a timing diagram showing operation of the memory of FIG. 3.

With reference to FIGS. 3 and 4, the static memory according to a first embodiment of the present invention will be explained.

In FIGS. 3 and 4, the elements or portions corresponding to those in FIGS. 1 and 2 are denoted by the same or similar references and detailed explanations thereon will be omitted.

As shown in FIG. 3, the memory according to the present embodiment is obtained by employing write circuits employing write circuits 12A′ and 12B′ in place of the write circuits 12A and 12B of FIG. 1. The write circuit 12A′ includes an input inverter composed of a D-FET $Q_{31}$ as a load element and a D-FET $Q_{32}$ as a driver transistor coupled between the ground potential and $V_{SS}$ of $-2$ V, and a level shift circuit having a D-FET $Q_{33}$ serving as an input transistor, a diode D1 and a D-FET $Q_{34}$ serving as a current source coupled between the ground potential and a low voltage source $V_{EE}$ of $-4.5$ V. The write circuit 12A′ receives the input $\overline{DI}$ of the range between $-1.5$ V and $-3.2$ V to produce an output of a range between $-2.5$ V and $-0.8$ V. The write circuit 12B′ has the same circuit structure as the write circuit 12A′. Thus, the level of the digit line to be supplied with the low write data signal is set at $-2.5$ V in the memory of this embodiment, which is lower than the conventional level of $-1.9$ V by 0.6 V. Also, in this embodiment column selection signals YSW1′–YSWn′ having levels between $-3.7$ V and $-2$ V which are shifted by $-0.5$ V from the conventional column selection signals YSW1–YSWn, are employed in order to switch the column selection D-FETs QY1A, QY1B–QYnA, QYnB.

According to the memory of FIG. 3, a voltage difference as large as 1.2 V which is the twice the conventional value of 0.6 V, is applied to the memory cell for inverting the state thereof in a write operation. Therefore, the inversion of the memory cell can be performed at a high speed.

Next, a write operation of this embodiment will be explained with reference to FIG. 4.

Prior to a time point $t_{21}$, one of the word lines WLm is raised from a low level ($-3.2$ V) to a high level ($-1.5$ V) and the column selection signal YSW1′ is also raised from $-3.7$ V to $-2$ V. In this instance, the input data DI and $\overline{DI}$ are at $-3.2$ V and $-1.5$ V, respectively and therefore the data lines DB and $\overline{DB}$ are at $-2.5$ V and $-0.8$ V, respectively and the selected digit lines DL1 and $\overline{DL1}$ are at $-2.5$ V and $-0.8$ V, respectively. Since the state of the selected memory cell MC is the same as the states of the input data DI, $\overline{DI}$ and the digit lines DL1 and $\overline{DL1}$ and they are in the equilibrium condition. Namely, the nodes $N_{11}$ and $N_{12}$ of the selected memory cell MC are at $-1.9$ V and $-1.3$ V and the data line DB and the digit line DL1 are at $-2.5$ V and the data line $\overline{DB}$ and the digit line $\overline{DL1}$ are $-0.8$ V. In this state, the FET QY1A is conductive to connect DB and DL1 while the FET QY1B is non-conductive so that the digit line $\overline{DL1}$ is biased via the pull-up resistor R2.

After the time point $t_{21}$, the states of the input data DI and $\overline{DI}$ are subjected to inversion of their states and thereafter the data lines DB, $\overline{DB}$ and the digit lines DL1, $\overline{DL1}$ follow the inversion of the input data DI, $\overline{DI}$. Then at a time point $t_{22}$, the levels of DI and $\overline{DI}$ are crossed for inversion and thereafter the levels of DB, $\overline{DB}$ and the levels of DL1, $\overline{DL1}$ are crossed at $-1.6$ V at a time point $t_{23}$ and then inverted. At the time point $t_{23}$, the FETs QY1A and QY1B are conductive to connect between DB and DL1 and between $\overline{DB}$ and $\overline{DL1}$, respectively. When $\overline{DL}$ becomes lower than $-1.6$ V, the memory cell MC starts the inversion operation. The nodes $N_{11}$ and $N_{12}$ of the memory cell MC intersect at a time point $t_{24}$, and reach the predetermined low level ($-1.9$ V) and the high level ($-1.3$ V) at a time point $t_{25}$ to complete the writing operation.

The low level of the digit line DLl is $-2.5$ V which is lower by 0.6 V than $-1.9$ V that is the low level of the memory cell. Therefore, the drain - source voltage VDS of the FET $Q_{16}$ of the memory cell is about 1.2 V between the time point $t_{23}$ and the time point $t_{24}$, which is about two times as great as 0.6 V of the conventional memory of FIG. 1, and the inversion time between the time point $t_{22}$ and the time point $t_{25}$ is approximately halved compared with that of the conventional memory. Furthermore, the time in which the low level of the digit line $\overline{DLl}$ reaches $-1.6$ V at which the memory cell initiates the inversion operation is very shortened compared with that of the prior art (usually, about 0.3 ns).

Figure 5:
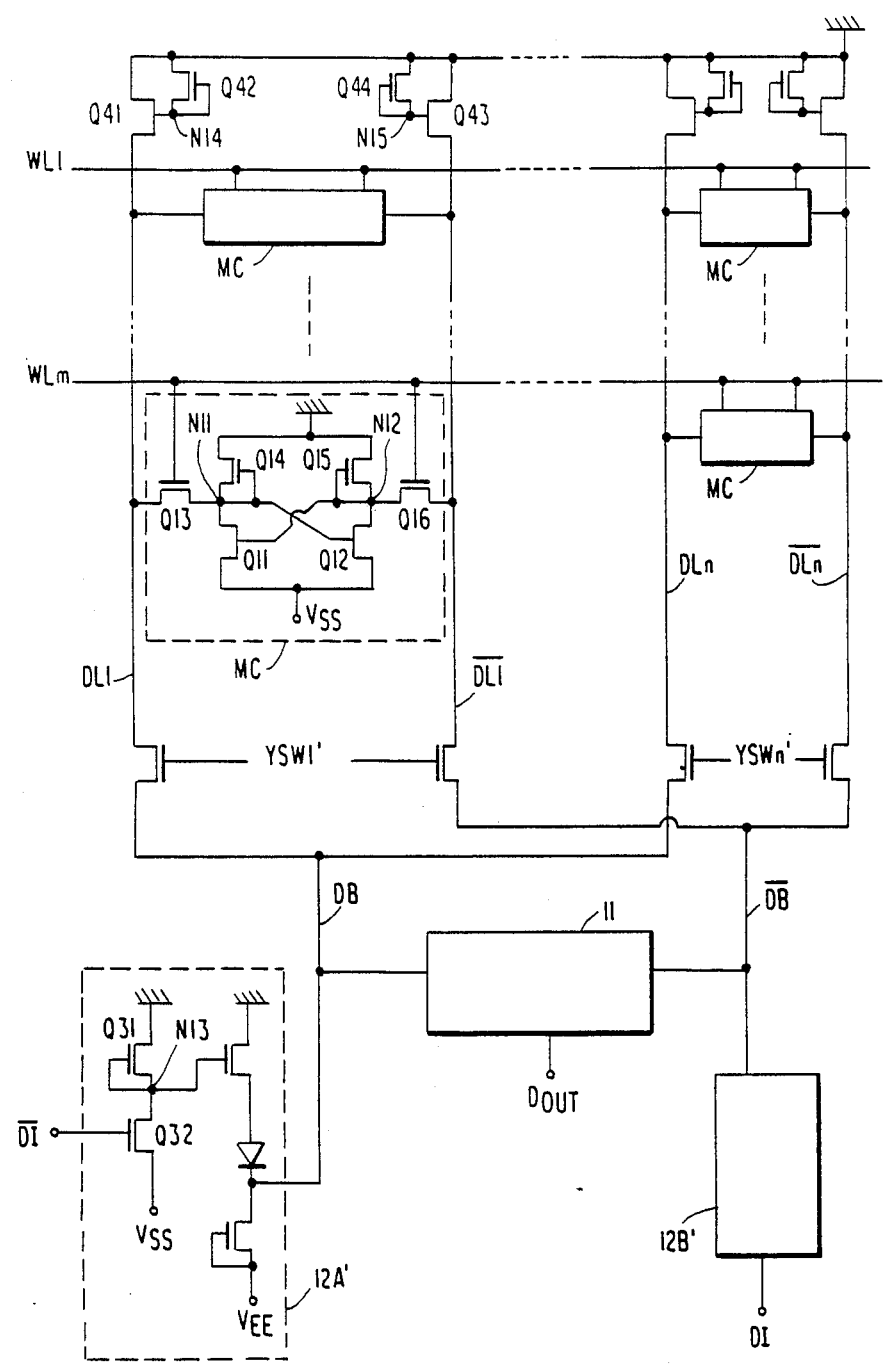
FIG. 5 is a schematic block diagram showing a major part of a static memory according to a second embodiment of the present invention.

With reference to FIG. 5, the memory according to another embodiment of the present invention will be explained.

This embodiment is featured in that in place of the pull-up resistors $R_1$ and $R_2$ connected to the digit lines, a pull-up circuit composed of D-FET $Q_{42}$ and E-FET $Q_{41}$ and a pull-up circuit composed of E-FET $Q_{43}$ and D-FET $Q_{44}$ are employed.

Therefore, the pull-up ability increases when the threshold voltage of E-FET's is lowered, and the high level of the digit line is reached more quickly than when the pull-up resistances RPU are used in the first embodiment, making it possible to shorten the time for writing.

Figure 6:
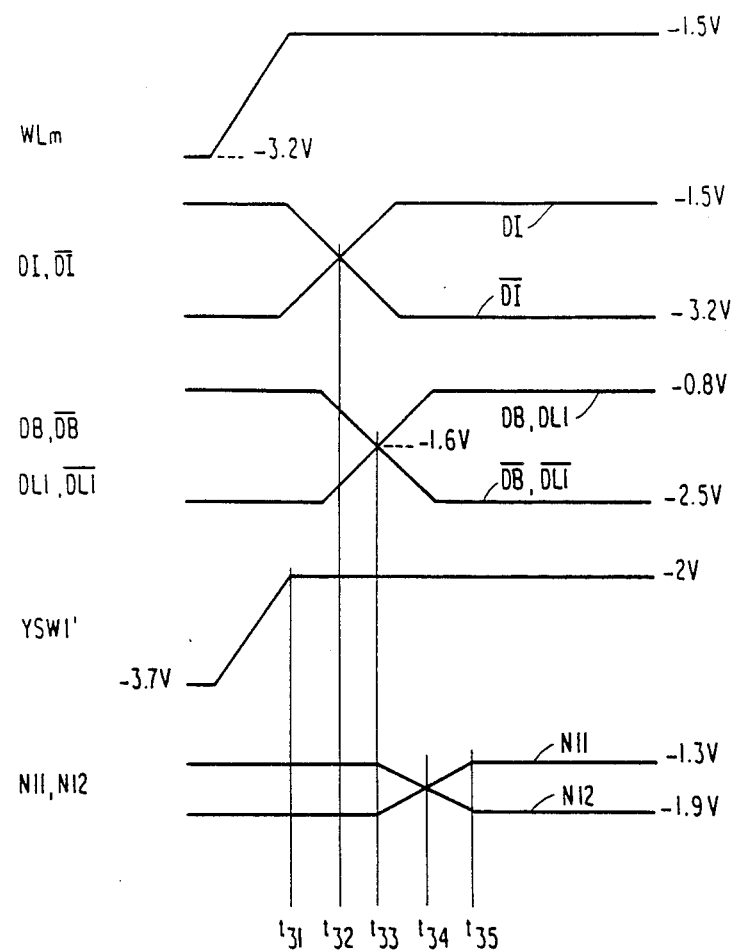
FIG. 6 is a timing diagram showing operation of the memory of FIG. 5.

The write operation of the memory of FIG. 5 is illustrated in FIG. 6 and has no substantial difference from that shown in FIG. 4.

According to the present invention as described above, shift means is arranged in the output stage of the writing circuit such that the low level of the output becomes lower than the power source potential on the low potential side of the memory cell. Therefore, the time for writing onto the memory cell can be quickened by more than two time as compared with that of the conventional art.

I claim:

1. A semiconductor memory device comprising a first voltage terminal for receiving a first voltage; a second voltage terminal for receiving a second voltage lower than said first voltage; a third voltage terminal for receiving a third voltage lower than said second voltage; a plurality of word lines; a plurality of digit lines; a plurality of memory cells, each of said memory cells including a flip-flop coupled to said first and second voltage terminals to operate by said first and second voltages and having a data node, and a transfer gate connected between said data node and one of said digit lines and having a control electrode connected to one of said word lines; a data line; a selection circuit connected between said data line and said digit lines for selectively establsihing a signal path between said data line and one of said digit lines; and a write circuit coupled to said first voltage terminal and said third voltage terminal to operate with said first and third voltages, and having an output node connected to said data line, said write circuit operatively supplying said data line with an input signal having a low level which is lower than a low level held at the data node of said memory cells.

2. The memory device according to claim 1, in which said flip-flop includes MESFETs.

3. The memory device according to claim 1, in which said write circuit includes MESFETs.

4. A semiconductor memory device comprising a plurality of word lines; a plurality of digit lines; a plurality of memory cells coupled to said word lines and said digit lines, each of said memory cells including a first voltage node receiving a first voltage, a second voltage node receiving a second voltage lower than said first voltage, first and second data node, a first MES field effect transistor connected between said first data node and said second voltage node and having a gate connected to said second data node, a second MES field effect transistor connected between said second data node and said second voltage terminal and having a gate connected to said first data node, first and second load elements connected between said first voltage node and said first and second data nodes, respectively, and a third MES field effect transistor connected between said first data node and one of said digit line and having a gate connected to one of said word lines, said first data node assuming one of a first level and a second level lower than said first level, a data line, a plurality of fourth MES field effect transistors connected between said data line and said plurality of digit lines, means for selectively rendering said fourth transistors conductive, a write circuit having an input node receiving an input signal and an output node coupled to said data line, said write circuit including an output drive circuit having a fifth MES field effect transistor connected between said first voltage node and said output node and a sixth MES field effect transistor connected between said output node and a third voltage node receiving a third voltage lower than said second voltage, said output node assuming one of a third level higher than said first level and a fourth level lower than said second level.

5. The semiconductor memory device according to claim 4, further comprising a plurality of pull-up resistors connected between said first voltage node and said plurality of digit lines.

* * * * *

UNITED STATES PATENT AND TRADEMARK OFFICE
CERTIFICATE OF CORRECTION

PATENT NO. : 4,933,903
DATED : June 12, 1990
INVENTOR(S) : Nakaizumi

It is certified that error appears in the above-identified patent and that said Letters Patent is hereby corrected as shown below:

Col. 2, line 53, delete "$\overline{DLn}$arranged" and insert --$\overline{DLn}$ arranged--.

Col. 3, line 33, delete "$\overline{DL1}$are" and insert --$\overline{DL1}$ are--.

Signed and Sealed this

Twentieth Day of August, 1991

Attest:

HARRY F. MANBECK, JR.

*Attesting Officer*     *Commissioner of Patents and Trademarks*